(12) United States Patent  (10) Patent No.: US 6,683,324 B2
Hayakawa  (45) Date of Patent: Jan. 27, 2004

(54) SEMICONDUCTOR LASER DEVICE IN WHICH THICKNESSES OF OPTICAL GUIDE REGION AND ALGAN CLADDING LAYERS SATISFY PREDETERMINED CONDITION

(75) Inventor: Toshiro Hayakawa, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 124 days.

(21) Appl. No.: 09/962,138

(22) Filed: Sep. 26, 2001

(65) Prior Publication Data
US 2002/0036293 A1 Mar. 28, 2002

(30) Foreign Application Priority Data
Sep. 26, 2000 (JP) ........................................ 2000-291390

(51) Int. Cl.[7] .............................................. H01L 27/15
(52) U.S. Cl. .............................. 257/79; 257/13; 257/81; 257/84; 257/99; 257/103
(58) Field of Search ................................ 257/81, 84, 88, 257/92, 93, 98, 99, 100, 690, 698, 200

(56) References Cited

U.S. PATENT DOCUMENTS 6,285,696 B1 * 9/2001 Bour et al. ..................... 372/45

OTHER PUBLICATIONS

Japanese Journal of Applied Physics, vol..34, Part 2, No. 7A, 1995, pp. L797.

IEEE Journal of selected Topics in Quantum Electronics, vol. 5, No. 3, 1999, pp. 65.

* cited by examiner

Primary Examiner—Long Pham
Assistant Examiner—Wai-Sing Louie
(74) Attorney, Agent, or Firm—Sughrue Mion, PLLC

(57) ABSTRACT

In a semiconductor laser device, an optical guide region includes an active layer and first and second optical waveguide layers respectively formed above and under the active layer, and first and second cladding layers are respectively formed above and under the optical guide region. Each of the first and second cladding layers includes at least one AlGaN layer. The thickness tg (nm) of the optical guide region and the thicknesses tc1 and tc2 of the first and second cladding layers satisfy a condition that $-0.25\, t_g + 500 \leq t_c \leq 500$ and $400 \leq t_g$ when $t_g \leq 1600$, and $100 \leq t_c \leq 500$ when $t_g > 1600$, where tc (nm) represents each of the thicknesses tc1 and tc2.

6 Claims, 4 Drawing Sheets

F I G. 3A
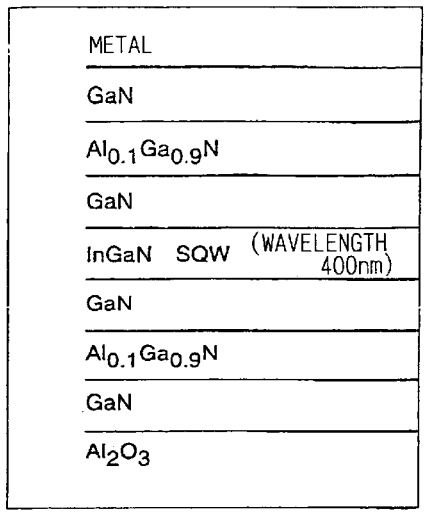
F I G. 3B
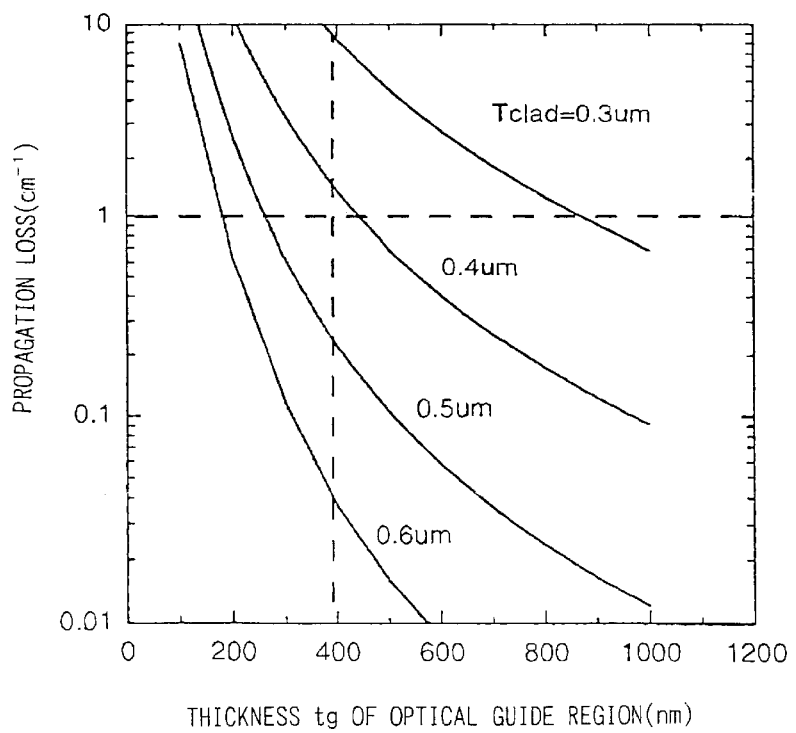
THICKNESS tg OF OPTICAL GUIDE REGION(nm)

SEMICONDUCTOR LASER DEVICE IN WHICH THICKNESSES OF OPTICAL GUIDE REGION AND ALGAN CLADDING LAYERS SATISFY PREDETERMINED CONDITION

BACKGROUND OF THE INVENTION

1. Field of the Invention

The present invention relates to a semiconductor laser device having an AlGaN cladding layer. In particular, the present invention relates to an AlInGaN semiconductor laser device having an AlGaN cladding layer.

2. Description of the Related Art

Currently, light emitting diodes (LEDs) and semiconductor laser devices made of AlInGaN materials are receiving attention as light sources which emit light in the short wavelength range up to 600 nm. For example, S. Nakamura et al. ("High-Brightness InGaN Blue, Green and Yellow Light-Emitting Diodes with Quantum Well Structures," Japanese Journal of Applied Physics, Vol. 34(1995), Part 2, No. 7A, L797–L799) report that high-brightness LEDs being made of AlInGaN materials and emitting light in the blue and green wavelength ranges have outstanding properties. At present, the blue and green high-brightness LEDs made of AlInGaN materials are widely used as light sources in signals and outdoor display apparatuses. In addition, semiconductor laser devices which emit light in the wavelength range of 390 to 410 nm are proceeding toward practical utilization. The shortest wavelength of laser light emitted from a semiconductor laser device which is available in the year 2000 is 630 nm. As the 390 to 410 nm laser is capable of producing a much smaller light spot than that produced by the 630 nm laser, it is expected to be used to increase recording density of optical disks. Further, short-wavelength light sources which emit light in the short wavelength range up to 450 nm are regarded as a promising candidate for light sources in digital-image forming apparatuses used in applications (such as printing) in which sensitized material having high sensitivity in the short wavelength range is used. When semiconductor laser devices are used as the light sources in the above applications, the semiconductor laser devices are required to emit a high-quality Gaussian light beam in a single oscillation mode.

However, in order to generate a high-quality Gaussian light beam in a single oscillation mode, the following problem should be overcome.

In order to satisfactorily confine light in the thickness direction of an optical waveguide structure, it is desirable that the thickness of each cladding layer including an AlGaN layer is at least 1 micrometer as in the cases of semiconductor laser devices made of AlGaAs, AlGaInP, or InGaAsP materials. However, since the AlGaN layers have great strain, cracks are produced (i.e., the crystals are broken) when the thicknesses of the AlGaN layers are increased. For example, M. Onomura et al. ("Analysis of Transverse Modes of Nitride-based Laser Diodes," IEEE Journal of Selected Topics in Quantum Electronics, Vol. 5, No. 3, 1999, pp. 765–770) report that when the thickness of an AlGaN cladding layer is increased to about 0.6 micrometers or more, a crack is produced. Therefore, the confinement of laser light becomes insufficient, propagation loss occurs, and the beam radiation pattern is deformed.

SUMMARY OF THE INVENTION

An object of the present invention is to provide a reliable semiconductor laser device which prevents production of a crack and leakage of light out of optical waveguide layers, and outputs a high-quality Gaussian laser beam having a uniform optical density.

According to the present invention, there is provided a semiconductor laser device comprising an optical guide region and first and second cladding layers. The optical guide region includes an active layer and first and second optical waveguide layers respectively formed above and under the active layer. The first and second cladding layers are respectively formed above and under the optical guide region. Each of the first and second cladding layers includes at least one AlGaN layer. The thickness tg of the optical guide layer and the thicknesses tc1 and tc2 of the first and second cladding layers satisfy a condition that $-0.25\ tg+500 \leq tc \leq 500$ and $400 \leq tg$ when $tg \leq 1600$, and $100 \leq tc \leq 500$ when $tg > 1600$, where tc (nm) represents each of the thicknesses tc1 and tc2 of the first and second cladding layers.

According to the above construction, the leakage of light from the optical guide region into the cladding layers can be reduced, and the propagation loss can also be reduced to at most 1 $cm^{-1}$. Therefore, a high-quality Gaussian laser beam having a uniform optical density can be obtained.

In addition, since the leakage of light from the optical guide region into the cladding layers is reduced, the driving current can also be reduced.

Further, since the differential efficiency is not decreased, the output power can be increased.

Preferably, the semiconductor laser device according to the present invention may also have one or any possible combination of the following additional features (i) and (ii).

(i) The first thickness tg further satisfies a condition that $tg \leq 2000$.

(ii) The at least one AlGaN layer is made of $Al_xGa_{1-x}N$, where $x \geq 0.1$.

DESCRIPTION OF THE DRAWINGS

FIG. 3A is a diagram schematically illustrating a layered structure of a semiconductor laser device which is optically similar to the layered structure of the first embodiment.

FIG. 3B is a graph indicating propagation loss as a function of the thickness tg (nm) of the optical guide region for respective values of the thickness Tclad of an $Al_{0.1}Ga_{0.9}N$ cladding layer, where the propagation loss is caused by optical absorption in a p electrode metal.

DESCRIPTION OF PREFERRED EMBODIMENTS

Embodiments of the present invention are explained in detail below with reference to drawings.

First Embodiment

The first embodiment of the present invention is explained below.

Figure 1A:
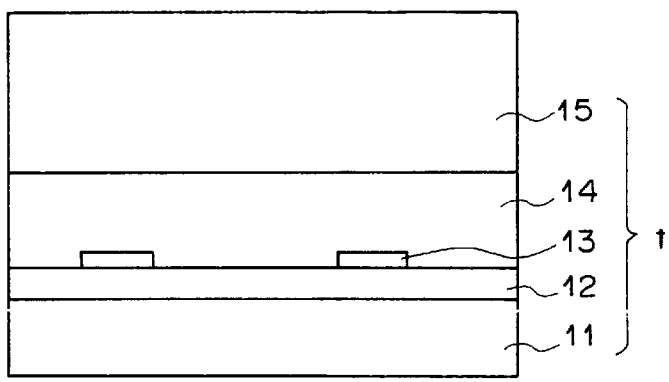
FIG. 1A is a cross-sectional view illustrating an intermediate stage of a production process of a GaN substrate which is used in a semiconductor laser device as a first embodiment of the present invention.

FIG. 1A is a cross-sectional view illustrating an intermediate stage of a production process of a GaN substrate which is used in a semiconductor laser device as a first embodiment of the present invention.

In the processes explained below, trimethyl gallium (TMG), trimethyl indium (TMI), trimethyl aluminum (TMA), and ammonia are used in growth of layers by the MOCVD (metal organic chemical vapor deposition) technique. In addition, silane gas is used as an n-type dopant gas, and cycropentadienyl magnesium ($Cp_2Mg$) is used as a p-type dopant gas.

As illustrated in FIG. 1A, a GaN layer 12 having a thickness of about 2.5 micrometers is formed on a sapphire substrate 11 by the MOCVD technique. Then, a $SiO_2$ layer 13 having a thickness of 0.1 micrometers is formed on the GaN layer 12 in a P-CVD (physical and chemical vapor deposition) system. Next, a $SiO_2$ mask pattern including stripe areas of the $SiO_2$ layer 13 is formed by photolithoetching, where the stripe areas are oriented in the $<1\bar{1}00>$ direction of the GaN crystal and spaced at intervals of 20 micrometers, and each have a width of 8 micrometers. Thereafter, another GaN layer 14 having a thickness of 15 micrometers is formed over the $SiO_2$ mask pattern, and a further GaN layer 15 having a thickness of 200 micrometers is formed on the GaN layer 14 by the HVPE (hydride vapor phase epitaxy) technique. In the process of forming the GaN layer 15 by the HVPE technique, mixture of GaCl and $NH_3$ is used, the growth temperature is 1000° C., and the flow rates of the $NH_3$, HCl, and $H_2$ gas are respectively 2 λ/min, 10 ml/min, and 3 λ/min, where GaCl is generated by reaction of Ga and HCl gas, and $H_2$ gas is used as career gas.

Figure 1B:
FIG. 1B is a cross-sectional view of the GaN substrate used in the semiconductor laser device as the first embodiment of the present invention.

Next, a portion of the layered structure of FIG. 1A corresponding to a thickness t from the back surface of the sapphire is removed by polishing so that a GaN substrate 15' having a thickness of 150 micrometers is obtained as illustrated in FIG. 1B.

Figure 2:
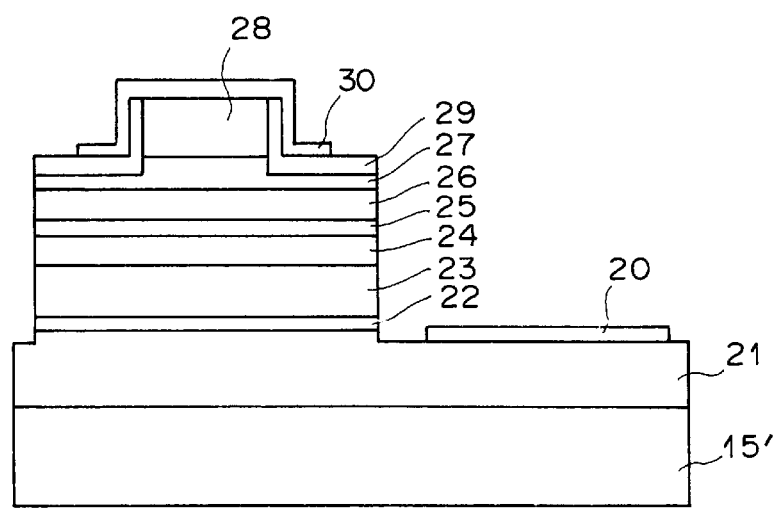
FIG. 2 is a cross-sectional view of the semiconductor laser device as the first embodiment of the present invention.

Thereafter, as illustrated in FIG. 2, an n-type Si-doped GaN buffer layer 21 having a thickness of 5 micrometers, an n-type Si-doped $In_{0.1}Ga_{0.9}N$ buffer layer 22 having a thickness of 0.1 micrometers, an n-type Si-doped $Al_{0.1}Ga_{0.9}N$ cladding layer 23 having a thickness of 0.45 micrometers, an n-type Si-doped GaN optical waveguide layer 24 having a thickness of 0.1 micrometers, an undoped active layer 25, a p-type Mg-doped GaN optical waveguide layer 26 having a thickness of 0.3 micrometers, a p-type Mg-doped $Al_{0.1}Ga_{0.9}N$ cladding layer 27 having a thickness of 0.45 micrometers, and a p-type Mg-doped GaN cap layer 28 having a thickness of 0.25 micrometers are formed on the GaN substrate 15' in this order by the normal-pressure MOCVD technique.

The active layer 25 has a multiple quantum well (MQW) structure including an undoped $In_{0.1}Ga_{0.9}N$ quantum well layer having a thickness of 3 nanometers, an undoped $Al_{0.04}Ga_{0.96}N$ barrier layer having a thickness of 0.01 micrometers, an undoped $In_{0.1}Ga_{0.9}N$ quantum well layer having a thickness of 3 nanometers, and a p-type Mg-doped $Al_{0.1}Ga_{0.9}N$ barrier layer having a thickness of 0.01 micrometers.

The n-type Si-doped GaN optical waveguide layer 24, the undoped active layer 25, and the p-type Mg-doped GaN optical waveguide layer 26 constitute an optical guide region.

Next, areas other than a ridge stripe area of the layered structure formed as above are removed to a mid-thickness of the p-type Mg-doped $Al_{0.1}Ga_{0.9}N$ cladding layer 27 corresponding to 0.1 micrometers above the p-type Mg-doped GaN optical waveguide layer 26 by reactive ion beam etching (RIBE) using chlorine ions so as to form a ridge stripe structure having a width of about 2.2 micrometers.

Thereafter, a SiN film 29 is formed by the plasma CVD (chemical vapor deposition) technique so as to cover the entire top surface of the layered structure being formed as above and having the ridge stripe structure, and then an unnecessary portion of the SiN film 29 located on the top of the ridge structure is removed by photolithography and etching.

Subsequently, p-type impurity is activated by heat treatment in $N_2$ atmosphere. Then, portions of the epitaxial layers other than the light emission area which includes the ridge stripe portion are removed by RIBE using chlorine ions until the n-type Si-doped GaN buffer layer 21 is exposed.

Thereafter, a Ti/Al/Ti/Au n electrode 20 and a Ni/Au p electrode 30 are formed as ohmic electrodes by vacuum evaporation and annealing in $N_2$ atmosphere. Finally, resonator surfaces are formed by cleavage.

The oscillation wavelength of the semiconductor laser device formed as above is 400 nm. Although the thickness of each of the $Al_{0.1}Ga_{0.9}N$ cladding layer is as small as 0.45 micrometers, the applicants have confirmed that the far-field pattern in the direction perpendicular to the junctions includes a monotonic single peak. That is, the semiconductor laser devices as the first embodiment can emit a high-quality single-mode Gaussian laser beam having a uniform optical density.

Although the above semiconductor laser device is formed on a GaN substrate, it is possible to form a semiconductor laser device on the sapphire substrate instead of the GaN substrate, where sapphire is an insulating material.

A layered structure of a semiconductor laser device which is a similar to the layered structure of the first embodiment is schematically illustrated in FIG. 3A, and propagation loss caused by optical absorption in a p electrode metal is indicated in FIG. 3B, where the propagation loss is calculated as a function of the thickness tg (nm) of the optical guide region for respective values of the thickness Tclad of each $Al_{0.1}Ga_{0.9}N$ cladding layer. Although the sapphire ($Al_2O_3$) substrate is included in the layered structure in FIG. 3A, the optical absorption in the sapphire ($Al_2O_3$) substrate is ignorable.

As indicated in FIG. 3B, when the thickness tg (nm) of the optical guide region is equal to or greater than 400 nm, the propagation loss can be reduced to 1 $cm^{-1}$ or less even when the thickness Tclad of each $Al_{0.1}Ga_{0.9}N$ cladding layer is slightly smaller than 0.5 micrometers. Since the propagation loss in almost all of the currently used semiconductor laser devices is less than 1 $cm^{-1}$, the preferable ranges of the cladding layer and the optical guide region are determined based on whether or not the propagation loss exceeds 1 $cm^{-1}$.

Figure 4:
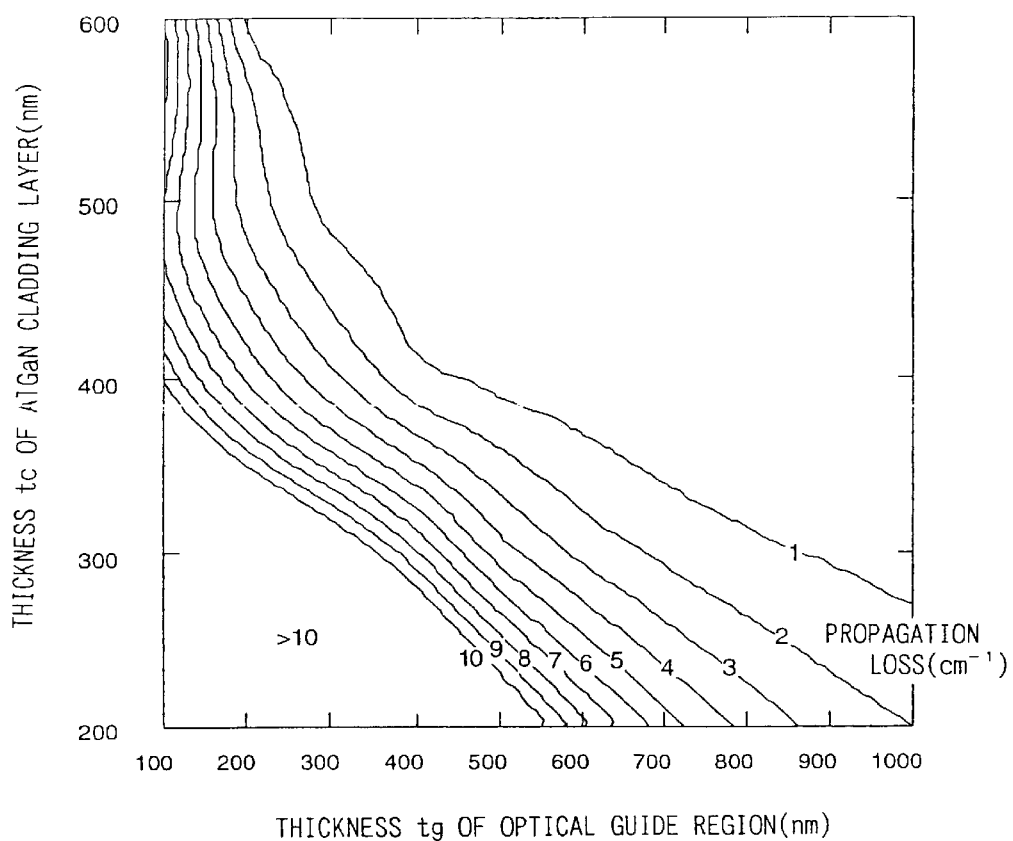
FIG. 4 is a diagram indicating with contour lines the propagation loss as a function of the thicknesses of the cladding layer and the optical guide region.

In FIG. 4, the propagation loss is indicated by contour lines as a function of the thicknesses of the cladding layer and the optical guide region. As illustrated in FIG. 4, the propagation loss does not exceed 1 $cm^{-1}$ when the thickness tg (nm) of the optical guide region and the thickness tc (nm) of the cladding layer satisfy the condition that $-0.25\ tg+500 \leq tc \leq 500$ and $400 \leq tg$.

In addition, when $tg>1600$ and $100 \leq tc \leq 500$, the propagation loss does not exceed 1 $cm^{-1}$.

The thickness tc of the cladding layer does not exceed 500 nm in the region in which the above condition is satisfied. When the thickness tc of the cladding layer does not exceed 500 nm, the cladding layer is not prone to crack. Conventionally, it is considered that light leaks out of the optical guide region into the cladding layer due to the small thickness of the cladding layer. However, when the thicknesses of the optical guide region and the cladding layer satisfy the above condition, the leakage of light from the optical guide region into the cladding layer can be suppressed. This suppression of the leakage in turn reduces light absorption of the electrodes enhanced by the light leaking out from the cladding layer. As a result, the propagation loss does not exceed 1 cm$^{-1}$. Therefore, it is possible to obtain a Gaussian laser beam having a uniform optical density. In addition, since little laser light leaks out of the optical guide region, the driving current can be reduced. Further, even when the chip length is increase, the differential efficiency does not decrease and thus the output power can be increased. Furthermore, the increased chip length keeps the level of the resistance small.

Although FIG. 4 shows the propagation loss for respective values of the thickness tg of the optical guide region in the range up to 1000 nm, the propagation loss linearly decreases with increase in the thickness tg of the optical guide region even when the thickness tg of the optical guide region exceeds 1000 nm. However, when the thickness tg of the optical guide region exceeds 2000 nm, the optical confinement factor of the quantum well layer in the optical guide region decreases. Therefore, the threshold current increases, and temperature characteristics deteriorate. Thus, it is preferable that the thickness tg of the optical guide region does not exceed 2000 nm. In addition, when the thickness tc of a cladding layer is too small, the propagation loss increases. Therefore, it is preferable that the thickness tc of each cladding layer is equal to or greater than 100 nm. Consequently, it is preferable that $100 \leq tc$ (nm) $\leq 500$ when the thickness tg of the optical guide region exceeds 1600 nm.

Second Embodiment

The second embodiment of the present invention is explained below. A cross section of the semiconductor laser device as the second embodiment is illustrated in FIG. 5, where the cross section is perpendicular to the direction of emission of laser light.

The semiconductor laser device as the second embodiment is different from the semiconductor laser device as the first embodiment in that a SiC substrate is used instead of the GaN substrate, and an n electrode is formed on the back surface of the SiC substrate. The thicknesses of the semiconductor layers in the semiconductor laser device as the second embodiment are the same as the corresponding semiconductor layers in the semiconductor laser device as the first embodiment.

Figure 5:
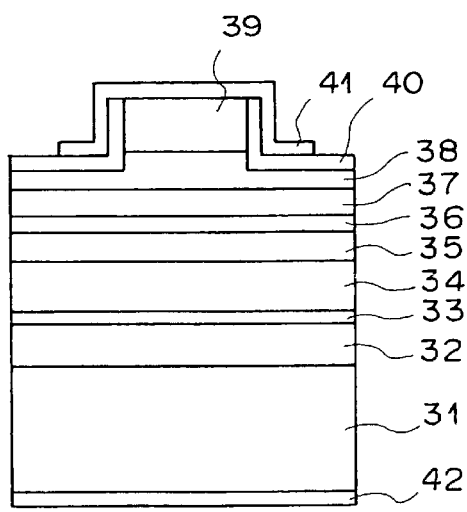
FIG. 5 is a cross-sectional view of a semiconductor laser device as the second embodiment of the present invention.

That is, as illustrated in FIG. 5, an n-type GaN buffer layer 32, an n-type In$_{0.1}$Ga$_{0.9}$N buffer layer 33, an n-type Al$_{0.1}$Ga$_{0.9}$N cladding layer 34, an n-type GaN optical waveguide layer 35, a multiple-quantum-well (MQW) active layer 36, a p-type GaN optical waveguide layer 37, a p-type Al$_{0.1}$Ga$_{0.9}$N cladding layer 38, and a p-type GaN cap layer 39 are formed on a SiC substrate 31 in this order. Next, areas other than a ridge stripe are removed to a mid-thickness of the p-type Al$_{0.1}$Ga$_{0.9}$N cladding layer 38 so as to form a ridge stripe structure. Thereafter, a SiO$_2$ film 40 is formed so as to cover the ridge stripe structure and the exposed areas of the Al$_{0.1}$Ga$_{0.9}$N cladding layer 38. Then, a stripe area of the SiO$_2$ film 40 at the top of the ridge stripe is removed, and a p electrode 41 is formed on the top of the ridge stripe. Finally, an n electrode 42 is formed on the back surface of the SiC substrate 31.

According to the above construction, the semiconductor laser device as the second embodiment can also emit a high-quality Gaussian laser beam having a uniform optical density.

Third Embodiment

The third embodiment of the present invention is explained below. A cross section of the semiconductor laser device as the third embodiment is illustrated in FIG. 6, where the cross section is perpendicular to the direction of emission of laser light.

The semiconductor laser device as the third embodiment is different from the semiconductor laser device as the first embodiment in that an internal stripe structure is formed instead of the ridge stripe structure. The thicknesses of the semiconductor layers in the semiconductor laser device as the third embodiment are the same as the corresponding semiconductor layers in the semiconductor laser device as the first embodiment.

Figure 6:
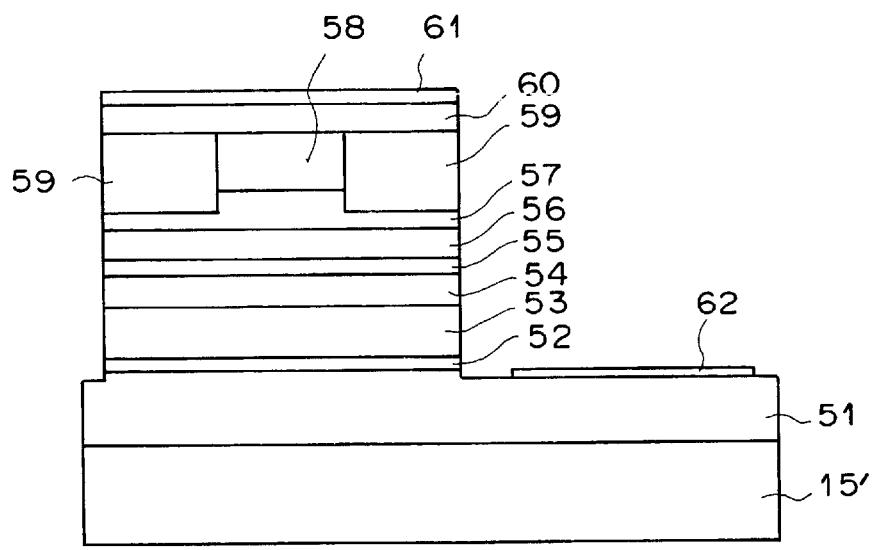
FIG. 6 is a cross-sectional view of a semiconductor laser device as the third embodiment of the present invention.

That is, as illustrated in FIG. 6, an n-type GaN buffer layer 51, an n-type In$_{0.1}$Ga$_{0.9}$N buffer layer 52, an n-type Al$_{0.1}$Ga$_{0.9}$N cladding layer 53, an n-type GaN optical waveguide layer 54, a multiple-quantum-well active layer 55, a p-type GaN optical waveguide layer 56, a p-type Al$_{0.1}$Ga$_{0.9}$N cladding layer 57, and a p-type GaN layer 58 are formed on the GaN substrate 15' in this order. Next, a SiO$_2$ film is formed on the layered structure formed as above, and a resist is applied to the SiO$_2$ film. Then, areas other than a stripe area are removed to a mid-thickness of the p-type Al$_{0.1}$Ga$_{0.9}$N cladding layer 57 by etching using chlorine gas. Next, an Al$_{0.1}$Ga$_{0.9}$N current confinement layer 59 is regrown so as to fill the spaces generated by the above removal, and a p-type GaN cap layer 60 and a p electrode 61 are formed over the p-type GaN layer 58 and the Al$_{0.1}$Ga$_{0.9}$N current confinement layer 59. In addition, an n electrode 62 is formed in a similar manner to the formation of the n electrode 20 in the first embodiment.

According to the above construction, the semiconductor laser device as the third embodiment can also emit a high-quality Gaussian laser beam having a uniform optical density. In addition, due to the internal stripe structure, the contact area between the electrode and the semiconductor layer can be increased. Therefore, the contact resistance can be reduced, and other characteristics can be improved. For example, the threshold current can be reduced.

Additional Matters (i) The semiconductor laser device according to the present invention may include an index-guided structure or a current confinement structure instead of the ridge stripe structure or the internal stripe structure.

(ii) In the first to third embodiments and in FIGS. 3B and 4, the composition of the cladding layers is Al$_{0.1}$Ga$_{0.9}$N, and the optical waveguide layer is made of GaN. In order to achieve carrier confinement, the composition (fraction) x of aluminum in Al$_x$Ga$_{1-x}$N is required to be equal to or greater than 0.1. In addition, the effect of the optical confinement is enhanced with increase in the composition (fraction) x of aluminum in Al$_x$Ga$_{1-x}$N. Therefore, the aforementioned condition is a sufficient condition for realizing satisfactory optical confinement with thin Al$_x$Ga$_{1-x}$N cladding layers when $x \geq 0.1$.

(iii) Although each cladding layer in the first to third embodiments has a uniform composition, each cladding layer may have a superlattice structure including at least one AlGaN layer. For example, each cladding layer may have a superlattice structure made of at least one AlGaN sublayer and at least one GaN sublayer.

(iv) Although the cladding layers in the first to third embodiments are formed immediately above or under the optical waveguide layers, other layers may be formed between the cladding layers and the optical waveguide layers. The advantages of the present invention are not affected by the formation of other layers between the cladding layers and the optical waveguide layers.

(v) Since the propagation loss in the semiconductor laser devices according to the present invention is small, the output power can be increased, and the power consumption can be reduced. In addition, the reliability of the semiconductor laser device can be increased. Further, since the light efficiently propagates through the semiconductor laser devices, it is possible to reduce laser light which oscillates in unnecessary radiation modes and enters the substrate. Therefore, a satisfactory single-peak beam radiation pattern can be obtained, and optical characteristics are improved.

What is claimed is:

1. A semiconductor laser device comprising:
   an optical guide region having a first thickness tg (nm), and including,
     an active layer, and
     first and second optical waveguide layers respectively formed above and under said active layer; and
   first and second cladding layers respectively having second and third thicknesses tc1 (nm) and tc2 (nm) and being formed above and under said optical guide region;
   each of said first and second cladding layers includes at least one AlGaN layer; and
   said first thickness tg and said second and third thicknesses tc1 and tc2 satisfy a condition that $-0.25\ tg+500 \leq tc \leq 500$ and $400 \leq tg$ when $tg \leq 1600$, and $100 \leq tc \leq 500$ when $tg > 1600$, where tc (nm) represents each of said second and third thicknesses tc1 (nm) and tc2 (nm).

2. A semiconductor laser device according to claim 1, wherein said first thickness tg further satisfies a condition that $tg \leq 2000$.

3. A semiconductor laser device according to claim 1, wherein said at least one AlGaN layer is made of $Al_xGa_{1-x}N$, and $x \geq 0.1$.

4. A semiconductor laser device comprising:
   an optical guide region having a first thickness tg (nm), and including,
     an active layer, and
     first and second optical waveguide layers respectively formed above and under said active layer; and
   first and second cladding layers respectively having second and third thicknesses tc1 (nm) and tc2 (nm) and being formed above and under said optical guide region; and
   said first thickness tg and said second and third thicknesses tc1 and tc2 satisfy a condition that
   $-0.25\ tg+500 \leq tc \leq 500$ and $400\ tg$ when $tg \leq 1600$,
   where tc represents each of said second and third thicknesses tc1 and tc2.

5. The semiconductor laser device of claim 4, wherein $100 \leq tc \leq 500$ when $tg > 1600$.

6. The semiconductor laser device of claim 5, wherein each of said first and second cladding layers includes at least one AlGaN layer and is made of $Al_xGa_{1-x}N$, where $x \geq 0.1$.

* * * * *